US005973530A

United States Patent [19]

Morris et al.

[11] Patent Number: 5,973,530

[45] Date of Patent: Oct. 26, 1999

[54] LOW POWER, HIGH VOLTAGE-TOLERANT BUS HOLDER CIRCUIT IN LOW VOLTAGE TECHNOLOGY

[75] Inventors: Bernard Lee Morris, Emmaus; Bijit Thakorbhai Patel, Breinigsville, both of Pa.

[73] Assignee: Lucent Technologies Inc., Murray Hill, N.J.

[21] Appl. No.: 09/087,303

[22] Filed: May 29, 1998

[51] Int. Cl.[6] .................. H03K 19/0948; H03K 19/0175

[52] U.S. Cl. ............................ 327/210; 327/333; 326/86

[58] Field of Search .................................... 327/199, 208, 327/210, 333, 108; 326/80, 81, 82, 83, 86, 87, 30

[56] References Cited

U.S. PATENT DOCUMENTS

| | | | |
|---|---|---|---|
| 4,612,461 | 9/1986 | Sood | 326/71 |
| 5,381,062 | 1/1995 | Morris | 326/68 |
| 5,432,462 | 7/1995 | Obregón et al. | 326/65 |
| 5,635,861 | 6/1997 | Chan et al. | 326/81 |
| 5,656,951 | 8/1997 | Hu et al. | 326/81 |
| 5,723,992 | 3/1998 | Yin et al. | 327/112 |
| 5,903,180 | 5/1999 | Hsia et al. | 327/333 |

*Primary Examiner*—Timothy P. Callahan
*Assistant Examiner*—Terry L. Englund

[57] ABSTRACT

An integrated, low power bus holder circuit implemented in low voltage technology is capable of interfacing with a relatively high voltage bus. In an illustrative embodiment, the bus holder circuit includes a first inverter for inverting a logic voltage present on a data bus and a second inverter for inverting the output of the first inverter. The second inverter is comprised of a series string of first and second pFETS and first and second nFETS, with the gates of the first pFET and first nFET coupled to the output of the first inverter. The data bus is coupled to a first circuit node between the second nFET and second pFET, and the bus logic level is maintained thereat. A third pFET is coupled to the second inverter and conducts current when a high logic voltage is present on the bus. A resistance device is coupled between a drain of the third pFET and a point of low reference potential. Advantageously, the circuit arrangement of the illustrative embodiment does not draw any DC power since it avoids the use of a separate, DC power consuming biasing circuit to bias the third pFET. A fourth pFET is preferably employed to eliminate leakage current in the first inverter.

14 Claims, 5 Drawing Sheets

LOW POWER, HIGH VOLTAGE-TOLERANT BUS HOLDER CIRCUIT IN LOW VOLTAGE TECHNOLOGY

FIELD OF THE INVENTION

The present invention relates to an integrated circuit bus holder circuit.

DESCRIPTION OF THE PRIOR ART

Bidirectional data transfer systems often employ bus holder circuits to temporarily store the most recent logic level appearing on a bidirectional data bus. With such temporary storage by the bus holder circuit (also called bus holder "cell"), input/output (I/O) logic circuits coupled to the bus can begin transitioning before they otherwise could. As a result, delays between logic transitions are diminished, thereby increasing data transfer speed between the bus and the I/O logic.

One conventional bus holder circuit is illustrated in FIG. 1. Bus holder 10 is comprised of back-to-back inverters I1 and I2 and functions to store logic voltages driven onto a bidirectional bus 18. The logic voltages originate from one of N logic circuits $L_1$–$L_N$ coupled to the bus via respective bus drivers $D_1$–$D_N$. In this example, each logic circuit is implemented in CMOS technology operating at 0–3.3 V logic. A driven signal value on the bus is maintained at storage node 12 by bus holder circuit 10 until it can be sampled by one of the drivers acting as a receiving device. That is, the bus voltage is held as long as all drivers $D_1$–$D_N$ connected to the bus are in a high impedance (Hi-Z) or "floating" state.

FIG. 2 depicts a typical circuit arrangement for bus holder cell 10. Inverter I1 is formed by p-channel field effect transistor (pFET) 11 and n-channel FET (NFET) 13 connected in series between the positive supply voltage VDD and ground VSS. The gates of devices 11 and 13 are tied to circuit node 12 where the bus voltage is held. Inverter I2 is formed by pFET 15 and nFET 17. This bus holder circuit can only be used in conjunction with interfaces that use the same voltages. For instance, if the bus holder is fabricated in 3.3 V technology, i.e., with devices designed to operate with VDD=3.3 V, then it cannot interface with a 5 V bus.

So-called "mixed-signal" systems which employ logic circuits operating at different voltages have become more prevalent in recent years. The logic circuits employed in such systems interface with one another via connection to a common bus—for example, 3.3 V CMOS logic often communicates with 5 V TTL logic. Accordingly, bus holder circuits have been developed for this application, such as the circuit shown in FIG. 3. Bus holder circuit 20 functions to store the latest logic level of the bus voltage $V_{BUS}$ at node 12 so long as all drivers $D_1$–$D_N$ connected to bus 18 are in the Hi-Z state. Bus holder 20 is implemented in 3.3 V technology (VDD=3.3 V) in this example. Thus, when a logic high level of 5 V originating from a 5 V logic circuit such as $L_1$ is placed on the bus and the associated driver $D_1$ enters the Hi-Z state, this logic high level is maintained by the bus holder circuit at 3.3 V at node 12. The 3.3 V is maintained until the level is sampled by either a 3.3 V logic circuit such as $L_2$ or by another 5 V logic circuit, or until the bus is actively driven. When sampled by a 5 V logic circuit, the 3.3 V is nevertheless perceived as a logic high since the logic high range for TTL logic is typically 2–5 V. (When a 3.3 V logic circuit drives a logic high of 3.3 V on the bus, it is also maintained at 3.3 V at node 12 by bus holder 20. Logic low levels on the bus of 0 V, wherever they originate, are maintained by the bus holder at 0 V.)

The bus holder voltage $V_{BUS}$ is applied through nFET M4 to a first inverter I1 formed of transistors M1 and M2. Transistor M4 acts as a voltage trimmer to keep the voltage at node 25 at a maximum of VDD-Vtn volts, where Vtn is the threshold voltage of the device. The output of inverter I1 is tied to the source of nFET M3 and to the gates of transistors M5 and M8. Transistors M5–M8 form a second inverter I2 of bus holder 20. A supply voltage VDD1 of 5 V is applied to the bulk terminals (also called "back-gate" or tub terminals) of pFETS M5, M6 and M9. The application of this voltage prevents forward biasing of the respective tub regions of these devices when the input voltage $V_{BUS}$ at node 12 is 5 V.

A biasing circuit formed by transistors M12, M13 and M14 generates a constant bias voltage $V_{REF}$ at circuit node 29. This bias circuit always draws DC power. Transistors M12–M14 are connected as diodes so that $V_{REF}$ is maintained at VDD-$V_{SD,M12}$ (source to drain voltage of pFET M12). PFET M9 receives $V_{REF}$ at its gate and $V_{BUS}$ at its source. When $V_{BUS}$ is low ($V_{BUS}$<VDD) device M9 is normally off and the voltage VX at node 27 is nearly equal to the voltage at node 28, approximately VDD-Vtn. This shuts off FET M5 and since transistor M8 is on due to the high gate voltage thereat, node 12 is maintained at 0 V. When $V_{BUS} \geqq$ VDD, FET M9 is turned on and voltage VX is nearly $V_{BUS}$. FET M6 is thereby turned off, thus preventing current flow from node 12 to the VDD voltage supply. Instead, current flow is through FETS M9, M3 and M2. In the steady state, the voltage at node 12 will fall to VDD and remain there until it is sampled by one of the drivers $D_1$–$D_N$.

The bus holder circuit 20 of FIG. 3, while effective in tolerating a relatively high voltage bus, has several drawbacks. First, the DC biasing arrangement of devices M12–M14 draws constant DC power. Second, when $V_{BUS} \geqq$ VDD, circuit node 25 is pulled lower than VDD due to the voltage trimmer M4, whereby FET M1 is partially turned on. Consequently, a leakage current path exists through transistor M1, creating another power drain. In addition, due to the feedback path through transistors M3 and M2 when $V_{BUS}$ is high, transistor M3 must be properly sized in relation to M2; otherwise, a voltage drop as high as 5 V may occur across the drain to source channel of device M3. Finally, the design requires a five volt power supply to provide the VDD1 voltage.

SUMMARY OF THE DISCLOSURE

The present disclosure is directed towards an integrated circuit, low power bus holder circuit implemented in low voltage technology which is capable of interfacing with a relatively high voltage bus. In an illustrative embodiment, the bus holder circuit includes a first inverter for inverting a logic voltage present on a data bus and a second inverter for inverting the output of the first inverter. The second inverter is comprised of a series string of first and second pFETS and first and second nFETS, with the gates of the first pFET and first NFET coupled to the output of the first inverter. The data bus is coupled to a first circuit node between the second nFET and second pFET, and the bus logic level is maintained thereat. A third pFET conducts current when a relatively high voltage is present on the bus. This pFET has its source coupled to the first circuit node, its drain coupled to the gate of the second pFET and its gate connected to receive a bias voltage. A resistance device is coupled between a drain of the third pFET and a point of low reference potential.

BRIEF DESCRIPTION OF THE DRAWINGS

The following detailed description, given by way of example and not intended to limit the present invention solely thereto, will best be appreciated in conjunction with the accompanying drawings, in which like reference numerals denote like parts or elements, wherein.

DETAILED DESCRIPTION OF CERTAIN PREFERRED EMBODIMENTS

A preferred embodiment of a low power, high voltage tolerant bus holder circuit in accordance with the invention will now be described. This embodiment overcomes the above-noted problems associated with prior art bus holder circuits, e.g., constant DC power draw, leakage current, etc. For explanatory purposes, the illustrative bus holder circuit will be described as operating with specific voltage levels; however, it is understood that the invention is not limited to any particular voltage level operation.

Figure 4:
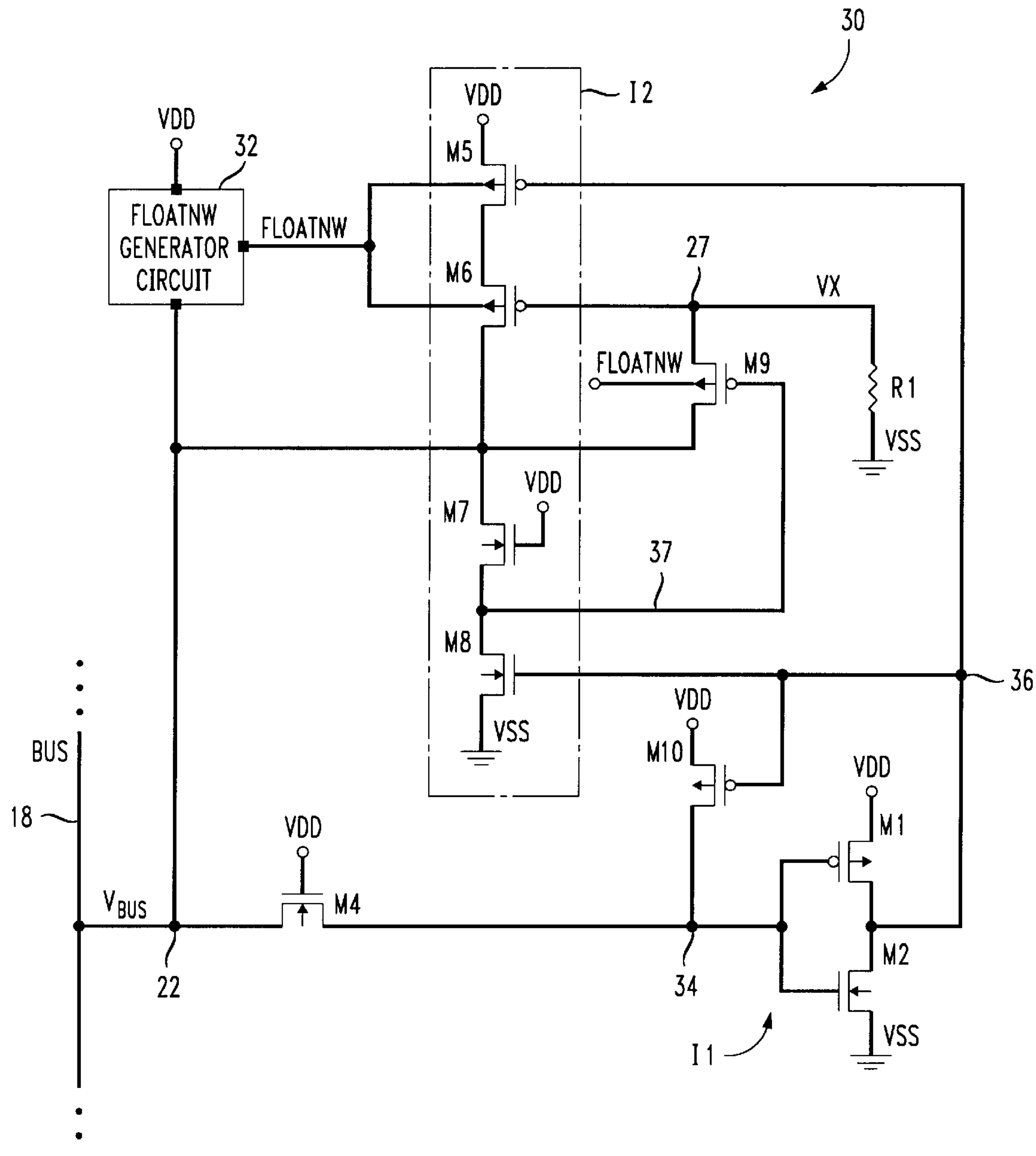
FIG. 4 is a circuit diagram of an illustrative high voltage-tolerant bus holder circuit in accordance with the invention; and, FIG. 5 shows an exemplary back gate biasing circuit that may be used within the illustrative bus holder circuit.

With reference now to FIG. 4, a schematic diagram of an illustrative integrated circuit bus holder circuit 30 in accordance with the invention is shown. Bus holder circuit 30 operates to maintain logic levels appearing on bidirectional bus 18 at circuit node 22 while all drivers connected to the bus are in the Hi-Z state. In particular, logic high levels greater than the bus holder supply voltage VDD are held at VDD whereas logic low levels are maintained at zero volts. By way of example, to illustrate operation of the circuit it will be assumed that the bus holder circuit is fabricated in 3.3 V technology so that VDD=3.3 V, and that 3.3 V logic as well as 5 V logic may be present on bus 18. Bus holder circuit 30 may be alternatively designed to operate with different logic levels—for instance, it may be fabricated in 2.5 V technology and designed to hold both 2.5 V and 3.3 V bus logic.

Figure 1:
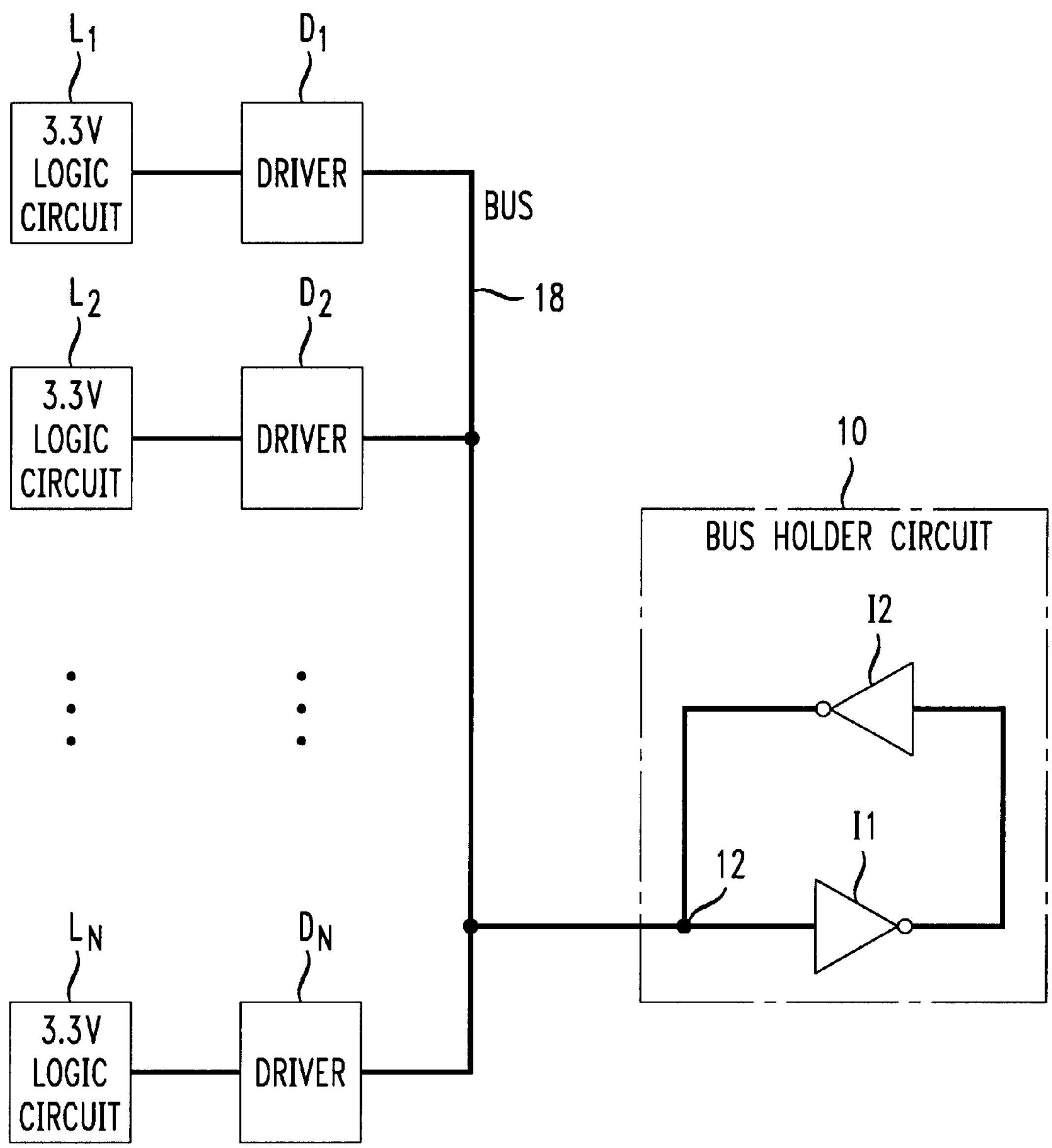
FIG. 1 illustrates a bidirectional bus and interface circuitry.
Figure 2:
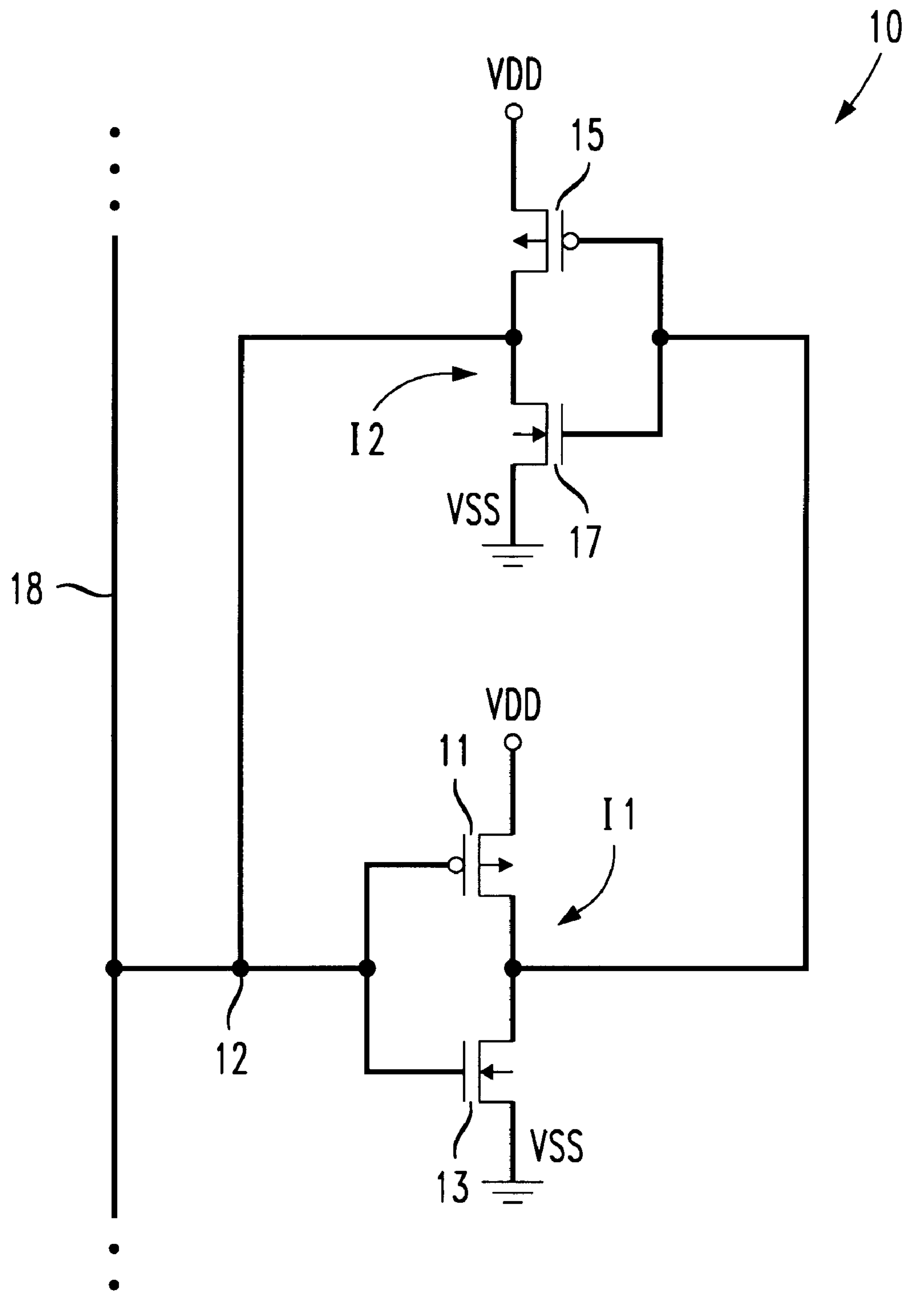
FIG. 2 is a circuit diagram of a prior art bus holder circuit.
Figure 3:
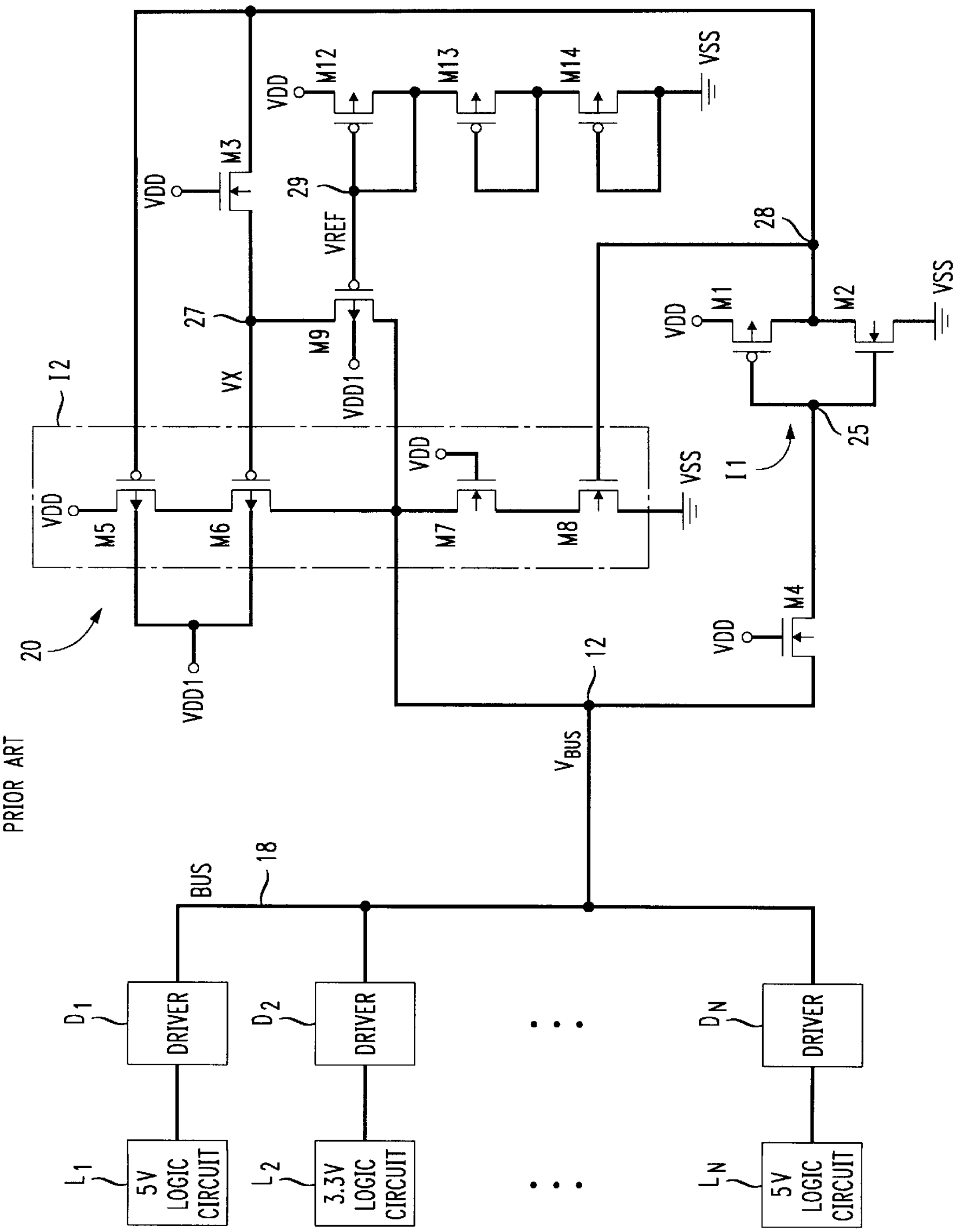
FIG. 3 is a circuit diagram of a prior art high voltage-tolerant bus holder circuit.

As is the case for bus holder 20 of FIG. 3, bus holder circuit includes a voltage trimmer FET M4 and first and second inverters I1 and I2. Other aspects of bus holder 30 are designed to overcome problems inherent in bus holder 20. Briefly, transistor M10 is employed to prevent leakage current through transistor M1 when $V_{BUS}$ is high. A separate, DC power consuming biasing circuit to bias transistor M9 is avoided by connecting the gate of device M9 to circuit node 37 between nFETS M7 and M8 and by employing a resistive element R1 between node 27 and VSS. This biasing scheme does not draw any DC power. Further, the circuit topology allows the design of inverters I1 and I2 to be made independent of one another. Moreover, the use of a separate 5 V voltage supply is avoided via the use of a floating n-well (FLOATNW) generator circuit 32 to bias the tubs of devices M5, M6 and M9.

In operation of bus holder circuit 30, the bus voltage $V_{BUS}$ is applied at circuit node 22 to the drain of nFET M4 which acts as a voltage trimmer to limit the voltage at circuit node 34 between 0 and (VDD-Vtn) volts, for $V_{BUS}$ varying between 0 and 5 V, respectively. That is, device M4 has its gate tied to VDD (=3.3 V) so that if $V_{BUS}$ is between 3.3 V and 5 V and Vtn is about 0.7 V, as is typical, the voltage at node 34 will be a maximum of about 2.6 V. The voltage at node 34 is inverted by inverter I1 which is formed by pFET M1 and nFET M2. PFET M10, which has its source tied to the VDD voltage supply, its drain tied to node 34 and its gate tied to the inverter I1 output at node 36, prevents leakage current through device M1. Without the presence of device M10, the trimmed logic high voltage at node 34 of about 2.6 V would properly turn on device M2, but would also partially turn on device M1 because the gate to source voltage of device M1, e.g., about −0.7 V, would be approaching its threshold voltage Vtp. Hence, leakage current would flow through FET M1. Device M10 prevents such leakage current by pulling up the voltage at node 34 to VDD. Since device M2 is turned on, the node 36 voltage is pulled down close to VSS (e.g., 0 V), thereby completely turning on device M10 such that node 34 is pulled up to nearly VDD. Consequently, FET M1 is turned off and leakage current is minimized or eliminated. On the other hand, when $V_{BUS}$ is low, device M10 is off. It is noted that to prevent device M10 from interfacing with the bus 18, device M10 is preferably embodied as a very weak device. This can be implemented in a standard manner by using a relatively longer channel length and/or a relatively smaller width for the device.

The back gate bias generator (FLOATNW generator) circuit 32 coupled between the VDD supply and circuit node 22 functions to prevent forward biasing of the tubs of devices M5, M6 and M9 when $V_{BUS}$ is high. This circuit is designed to generate an output voltage FLOATNW such that, $$\text{FLOATNW}=\text{VDD for } V_{BUS}\leqq(\text{VDD}+\text{Vtp}); \quad (1)$$

$$\text{FLOATNW}=V_{BUS} \text{ for } V_{BUS}>(\text{VDD}+\text{Vtp}), \quad (2)$$

where Vtp is the assumed threshold voltage for any one of pFETS M5, M6 and M9, typically −0.7 V.

The FLOATNW voltage is applied to the tubs (back-gate or bulk terminals) of the respective devices M5, M6 and M9. As such, the use of the FLOATNW generator eliminates the requirement for a separate 5 V supply to bias the tubs. Since FLOATNW generator 32 only receives a 3.3 V operating voltage (VDD) its output essentially "floats up" to $V_{BUS}$ when $V_{BUS}$ exceeds VDD.

Figure 5:
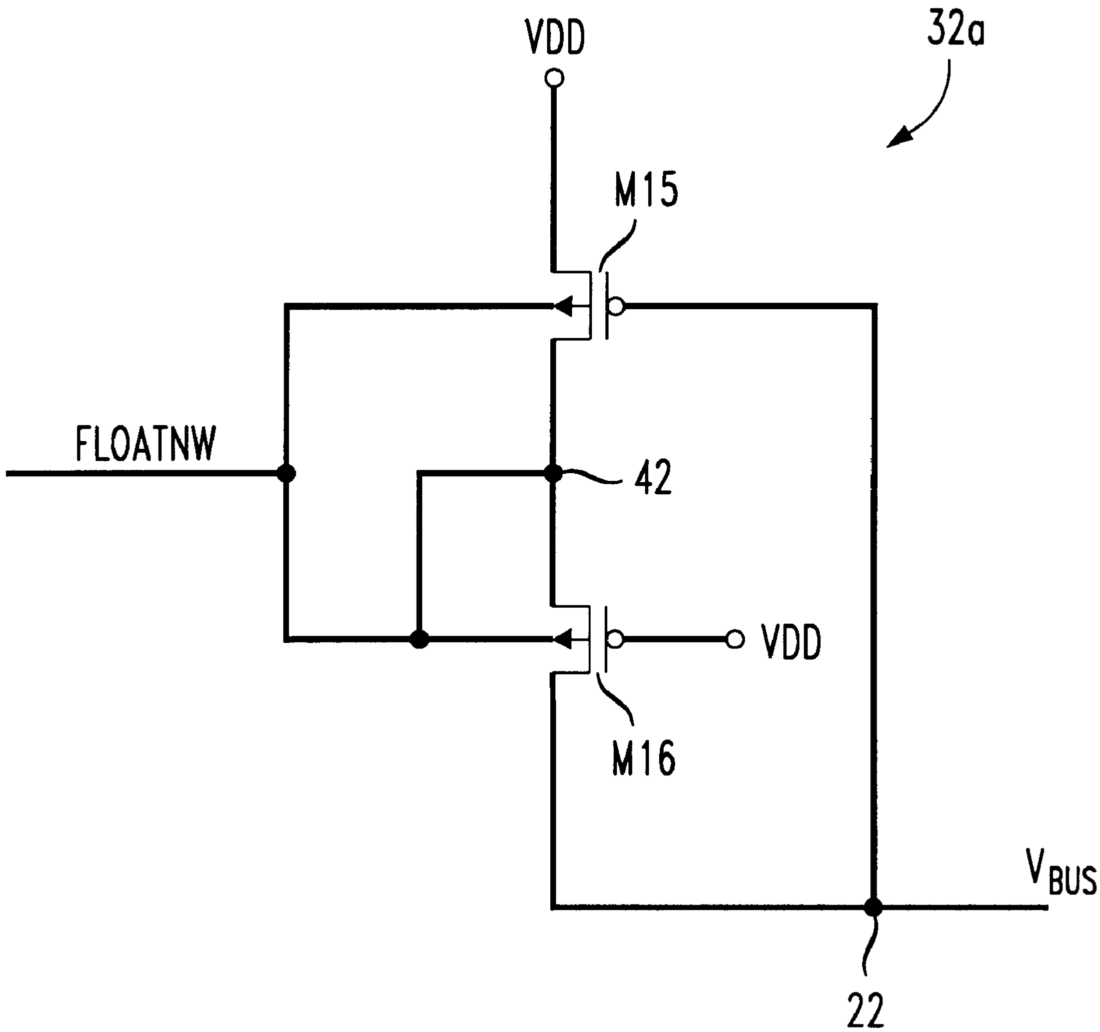

FIG. 5 illustrates an exemplary FLOATNW generator 32*a* which may be used within bus holder 30. Generator 32*a* is comprised of a pair of pFETS M15 and M16 with back gate terminals tied together. The supply voltage VDD is applied to both the source of M15 and to the gate of M16. The drain of M16 and the gate of M15 are each tied to circuit node 22 where $V_{BUS}$ is applied. The back gates of both pFETS are also tied to circuit node 42 connecting the drain of M15 to the source of M16. When $V_{BUS}\leqq$(VDD+Vtp), device M15 turns on, forcing node 42 to approximately VDD so that the voltage FLOATNW≈VDD. When $V_{BUS}>$(VDD+Vtp), device M15 is off and the voltage at node 42 floats up to VBUS, whereby FLOATNW≈$V_{BUS}$.

In any event, other circuit arrangements may alternatively be employed to form a suitable FLOATNW generator for use within the bus holder circuit of the present invention. See, for example, U.S. Pat. No. 5,635,861 entitled OFF CHIP DRIVER CIRCUIT, which discloses alternative back gate biasing circuits.

Returning to FIG. 4, in contrast to the prior art bus holder described above, a separate biasing circuit for pFET M9 is avoided in the illustrative embodiment by connecting the gate of M9 to circuit node 37 between the source of nFET M7 and the drain of nFET M8. FET M7 operates as both a protection device for FET M8 and to provide a bias voltage at node 37 when $V_{BUS}$ is high. That is, when $V_{BUS}$ is high, the $V_{BUS}$ voltage is dropped across the drain to source channels of both FETS M7 and M8 and the voltage at node 37 is a maximum of VDD-Vtn, or 2.6 V for a typical Vtn voltage of 0.7 V.

The drain of device M9 is connected at circuit node 27 to the gate of FET M6. Resistance device R1 is connected between node 27 and VSS and provides a resistance in the kΩ range. This device may be embodied as a physical resistor or a transistor (or plural transistors) appropriately biased at its gate to provide a desired resistance through its conducting channel. (If a transistor is employed, its drain is connected to node 27 and its source to VSS in the case of an nFET.) With FET M9 connected in this manner, when $V_{BUS}$ is low, FET M9 is turned off because its gate voltage at node 37 is no lower than its source voltage at node 22.

More specifically, when $V_{BUS}$ is low ($V_{BUS}$<VDD), the output of inverter I1 at node 36 is approximately VDD, which turns FET M8 on. This pulls node 37 low, turning on FET M7 as well. Meanwhile, FET M5 is off due to the high voltage at its gate, such that the VDD supply voltage is dropped across the source to drain channels of both FETS M5 and M6, and node 22 is maintained at zero volts. Device M9 is off in this condition.

When $V_{BUS}$ is high ($V_{BUS}$≧VDD) the voltage at node 36 is low, thereby shutting off device M8. In this case, the maximum voltage at node 37 is VDD-Vtn as mentioned above. Consequently, FET M9 is turned on, and since the resistance of device R1 is relatively high, the voltage VX at node 27 is brought up to nearly $V_{BUS}$. This turns FET M6 off, thus preventing current flow from node 22 to the VDD voltage supply even though FET M5 is on. (FET M5 is on because its gate is tied to node 36, which is low, and its source is tied to VDD.) In the steady state, when $V_{BUS}$ is high, any excessive voltage above VDD is discharged due to the capacitive load on the bus, and the voltage at node 22 falls to VDD. The back-to-back voltage inversion of inverters I1 and I2 ensures that the voltage at node 22 is maintained at the VDD value.

Accordingly, in comparison to bus holder 20 of FIG. 3 which employs feedback device M3, the feedback path of bus holder 30 is modified via the elimination of device M3 and via the use of resistance device R1 to sink current when $V_{BUS}$ is high. Therefore, since the design of device M2 need not depend on device M3 as in the prior art case, the design of the two inverters I1 and I2 in bus holder 30 can be made completely independent of one another. In addition, by eliminating the DC power consuming bias supply for transistor M9 and also erasing the leakage current within inverter I1, bus holder circuit 30 essentially consumes no DC power. Yet another advantage of the illustrative embodiment is the elimination of a separate 5 V power supply to bias the tubs of devices M5, M6 and M9.

While the present invention has been described above with reference to specific embodiments thereof, it is understood that one skilled in the art may make many modifications to the disclosed embodiments without departing from the spirit and scope of the invention. For instance, if the bus holder circuit is fabricated on an integrated circuit chip in which a relatively high voltage supply, e.g., 5 V, is readily available, that voltage supply may be used in place of the FLOATNW generator to bias the tubs of the respective devices. Further, the bus holder circuit can be fabricated in higher or lower voltage technology (i.e., other than 3.3 V technology) to interface with a bidirectional bus carrying higher voltage levels than the bus holder circuit supply voltage. Moreover, it is possible to bias device M9 differently and still attain low power consumption for the bus holder circuit. For instance, suitable biasing of device M9 may be achieved by connecting its gate to circuit node 34, or to VDD, instead of to circuit node 37. Finally, for bus holders implemented in lower voltage technology such as 2.5 V or lower, it may be possible to use only one pFET within the second inverter I2 that is capable of withstanding the higher bus voltage across its conducting channel. Accordingly, these and other modifications are intended to be included within the scope of the invention as defined by the appended claims.

What is claimed is:

1. An integrated circuit comprising a bus holder circuit, characterized in that said bus holder circuit comprises:

a first inverter for inverting a logic voltage of a data bus;

a second inverter having first and second n-channel field effect transistors (nFETS) coupled in series with a first p-channel field effect transistor (pFET), said first nFET and said first pFET each having a gate coupled to an output of said first inverter, said second nFET having a gate connected to receive a reference voltage, wherein a first circuit node between said first pFET and said second nFET is coupled to said bus;

an additional pFET operative to conduct current when a relatively high logic voltage is present on said bus and having a source coupled to said first circuit node and a gate connected to receive a bias voltage; from a second circuit node in between said first and second nFETS and a resistance means coupled between a drain of said additional pFET and a point of low reference potential.

2. The integrated circuit of claim 1 wherein said second inverter further comprises a second pFET coupled in series between said first pFET and said second nFET, said first circuit node being between said second pFET and said second nFET.

3. The integrated circuit of claim 2 wherein each of said first, second and additional pFETS has a back gate terminal coupled to receive a relatively high back gate bias voltage to prevent forward biasing of a tub region within each pFET.

4. The integrated circuit of claim 3 wherein said back gate bias voltage is supplied by a FLOATNW generator coupled between said bus and a source of supply voltage, said FLOATNW generator providing said back gate bias voltage approximately equal to the logic voltage of said data bus when the logic voltage exceeds the supply voltage, and approximately equal to the supply voltage when the logic voltage is lower than the supply voltage.

5. The integrated circuit of claim 4 wherein said FLOATNW generator is comprised of fourth and fifth pFETS with respective back gate terminals connected together, said source of supply voltage being coupled to the source of said fourth pFET and to the gate of said fifth pFET, said logic voltage being applied to the drain of said fifth pFET and to the gate of said fourth pFET, with said back gate terminals of said fourth and fifth pFETS providing said back gate bias voltage and being coupled to a third circuit node between the drain of said fourth pFET and the source of said fifth pFET.

6. The integrated circuit of claim 1, further comprising a voltage trimmer device coupled between said bus and an input of said first inverter, and a fourth pFET having a gate coupled to said output of said first inverter, a source coupled to a source of supply voltage and a drain coupled to the input of said first inverter, said fourth pFET operable to reduce leakage current within said first inverter.

7. The integrated circuit of claim 6 wherein said voltage trimmer device comprises an nFET having a drain coupled to said bus, a source coupled to the input of said first inverter, and a gate coupled to said source of supply voltage.

8. The integrated circuit of claim 1 wherein said resistance means is selected from a group consisting of a resistor and at least one transistor having a gate connected to receive a biasing voltage.

9. The integrated circuit of claim 1 wherein said first pFET has its source coupled to a source of low supply voltage, and said second nFET has its gate coupled to said source of low supply voltage as said reference voltage.

10. The integrated circuit of claim 1 wherein said first and second inverters are each coupled to a source of 3.3 V supply voltage and said bus is operable to carry a logic high voltage up to 5 V, wherein aid bus holder circuit maintains said logic high voltage as 3.3 V at said first node during a floating state of said bus after said bus had received said logic high voltage.

11. An integrated circuit comprising a bus holder circuit, characterized in that said bus holder circuit comprises:

a first inverter for inverting a logic voltage of a data bus;

a second inverter having a series string of first and second n-channel field effect transistors (nFETS) and first and second p-channel field effect transistors (pFETS), said first pFET having a source connected to receive a supply voltage, a gate coupled to an output of said first inverter, and a drain coupled to a source of said second pFET, said first nFET having a source coupled to a point of low reference potential and a gate coupled to said output of said first inverter, said second nFET having a gate connected to receive said supply voltage and a source coupled to a drain of said first nFET, wherein a first circuit node between a drain of said second pFET and a drain of said second nFET is coupled to said bus;

a third pFET operative to conduct current when a logic voltage higher than said supply voltage is present on said bus and having a source coupled to said first circuit node, a drain coupled to a gate of said second pFET and a gate connected to receive a bias voltage from a second circuit node in between said first and second nFETS;

a resistance means coupled between said drain of said third pFET and said point of low reference potential;

each of said first, second and third pFETS having a back gate terminal connected to receive a relatively high back gate bias voltage to prevent forward biasing of a tub region within each pFET;

a voltage trimmer device coupled between said bus and an input of said first inverter; and a fourth pFET having a gate coupled to said output of said first inverter, a source connected to receive said supply voltage and a drain coupled to the input of said first inverter, said fourth pFET operable to reduce leakage current within said first inverter.

12. The integrated circuit of claim 11 wherein said resistance means is selected from a group consisting of a resistor and at least one transistor having a gate connected to receive a reference voltage.

13. The integrated circuit of claim 11 wherein said back gate bias voltage is supplied by a FLOATNW generator coupled between said bus and a source of said supply voltage, said FLOATNW generator providing said back gate bias voltage approximately equal to the logic voltage of said data bus when the logic voltage exceeds the supply voltage, and approximately equal to the supply voltage when the logic voltage is lower than the supply voltage.

14. The integrated circuit of claim 13 wherein said FLOATNW generator is comprised of fifth and sixth pFETS with respective back gates connected together, said source of supply voltage being coupled to the source of said fifth pFET and to the gate of said sixth pFET, said logic voltage being applied to the drain of said sixth pFET and to the gate of said fifth pFET, said back gates being coupled to a third circuit node between the drain of said fifth pFET and the source of said sixth pFET and providing said back gate bias voltage.

* * * * *